(12) United States Patent
Ishii

(10) Patent No.: US 6,815,960 B2
(45) Date of Patent: Nov. 9, 2004

(54) ELECTRON BEAM TEST SYSTEM AND ELECTRON BEAM TEST METHOD

(75) Inventor: Tatsuya Ishii, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/226,140

(22) Filed: Aug. 23, 2002

(65) Prior Publication Data

US 2003/0038645 A1 Feb. 27, 2003

(30) Foreign Application Priority Data

Aug. 27, 2001 (JP) .......................... 2001-255993
Nov. 7, 2001 (JP) .......................... 2001-342201

(51) Int. Cl.⁷ .......................................... G01R 31/305
(52) U.S. Cl. ................................. 324/751; 324/752
(58) Field of Search ........................ 324/73.1, 158.1, 324/751, 765, 504; 250/306, 309, 310–311; 356/400–401, 364

(56) References Cited

U.S. PATENT DOCUMENTS

| 3,549,999 | A | * | 12/1970 | Norton ........................ 324/751 |
| 5,592,099 | A | * | 1/1997 | Kuribara et al. ............ 324/751 |
| 5,703,492 | A | * | 12/1997 | Nakamura et al. .......... 324/751 |
| 6,476,390 | B1 | * | 11/2002 | Murakoshi et al. ......... 250/310 |

FOREIGN PATENT DOCUMENTS

| JP | 2-275368 | 11/1990 |
| JP | 3-254053 | 11/1991 |
| JP | 5-256917 | 10/1993 |
| JP | 8-184651 | 7/1996 |
| JP | 9-33616 | 2/1997 |
| JP | 11-242071 | 9/1999 |

OTHER PUBLICATIONS

Ishii et al., "Study of Electron–Beam Probe for LSI Process Failure Analysis", Technical Report of IEICE. R2001–31, SSS2001–26 (2001–12), The Institute of Electronics, Information and Communication Engineers, pp. 13–20, Nov. 8, 2001. (w/abstract).

U.S. patent application Ser. No. 10/280,018, Ishii, filed Oct. 25, 2002.

* cited by examiner

Primary Examiner—Minh N. Tang
(74) Attorney, Agent, or Firm—Oliff & Berridge, PLC

(57) ABSTRACT

An electron beam test system is capable of judging high/low potentials with respect to a DC signal and a signal having no change in potential. The electron beam test system analyzes breakdowns by irradiating an electron beam to a semiconductor integrated circuit device to be analyzed and obtaining a potential contrast. The electron beam test system has a tester, an electron gun and a detector. The tester holds a test pattern to be supplied to the semiconductor integrated circuit device for a predetermined time, and performs an operation of changing direct current power source and an input signal to a reference potential at high speed on the semiconductor integrated circuit device. The electron gun irradiates the electron beam to the semiconductor integrated circuit device. The detector takes in the potential contrast right after the direct current power source and the input signal are changed to the reference potential.

45 Claims, 9 Drawing Sheets

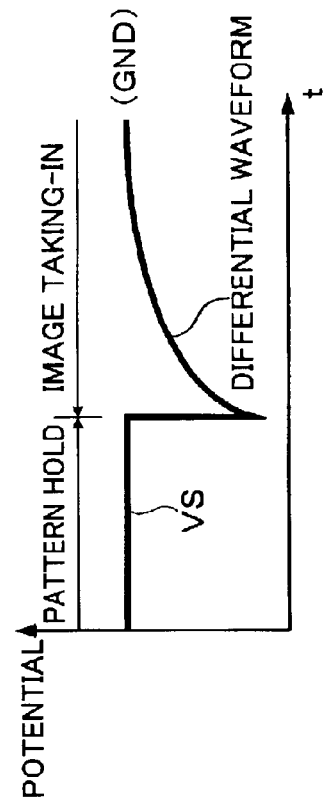
FIG. 3E
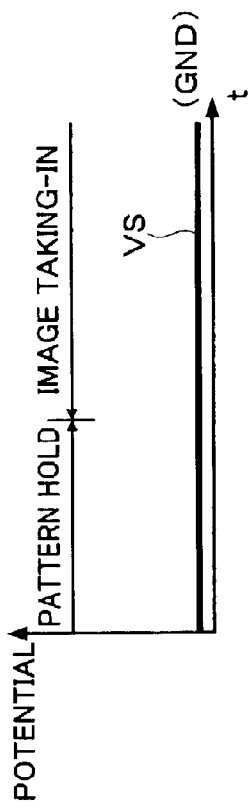
FIG. 3C
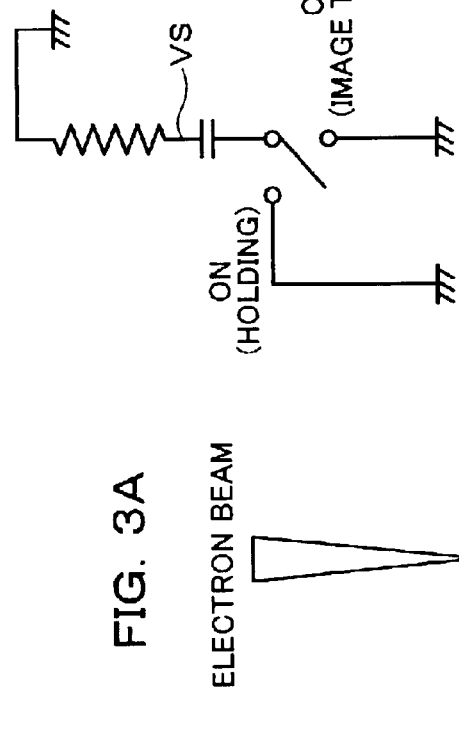
FIG. 3D
FIG. 3B
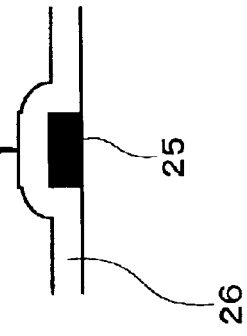
FIG. 3A

FIG. 5 RELEVANT ART

RATIO OF IMAGE INFORMATION STORED
INTO FRAME MEMORY AT EACH TIME

ELECTRON BEAM TEST SYSTEM AND ELECTRON BEAM TEST METHOD

Japanese Patent Application No. 2001-255993 filed on Aug. 27, 2001, and Japanese Patent Application No. 2001-342201 filed on Nov. 07, 2001, are hereby incorporated by reference in their entirety.

BACKGROUND OF THE INVENTION

The present invention relates to an electron beam test system and an electron beam test method, and particularly relates to an electron beam test system and an electron beam test method can judge high/low potentials with respect to a DC signal and a signal having no change in potential from the previous time of timing to be observed.

FIG. 4 is a constructional view showing a conventional electron beam test system.

The electron beam test system 100 has an electron beam prober 101, a high accuracy LSI tester 102 for operating a device connected to this electron beam prober 101, a control EWS (engineering work station) 106 for controlling operations of the electron beam prober 101 and the high accuracy LSI tester 102.

The electron beam prober 101 has a structure constructed such that a beam blanker 103 for forming a pulse beam, an analytical grid 104 for observing a potential distribution and measuring a waveform, and a waveform measuring unit 105 connected to this analytical grid 104 are added to a SEM (scanning electron microscopy). A fixing stage 109 for placing a semiconductor wafer is arranged on an X-Y moving stage 108.

A non-defective or defective semiconductor wafer (semiconductor integrated circuit device) is placed on the fixing stage 109.

This semiconductor wafer is connected to a test head 110, and is operated by this test head 110. In other words, a predetermined test pattern signal including a clock signal is inputted from the test head 110 to each input terminal of the semiconductor wafer.

An electron beam is irradiated by a field emission gun (FE-Gun) 107 to the operated semiconductor wafer through the beam blanker 103.

A secondary electron from the semiconductor wafer is detected by a secondary electron detector 111 through the analytical grid 104, and a voltage waveform of the operated semiconductor wafer, etc. are measured by the waveform measuring unit 105.

FIG. 5 shows one example of the test pattern signal supplied to the semiconductor wafer and its measured waveform. Here, one example of a clock signal waveform of wiring of the semiconductor wafer and a differential waveform appearing on a passivation film is shown.

As shown in this figure, the differential waveform appearing on the passivation film is detected in the voltage waveform measurement in the electron beam test system. In timing in which the test pattern signal supplied to the semiconductor wafer becomes a pattern signal to be observed, a clock period is lengthened and a potential contract image at an arbitrary time is taken in.

In the above conventional electron beam test system, the image of a low potential becomes light and the image of a high potential becomes dark in a pulse signal such as a clock signal. Accordingly, the observation can be made similarly to a state having no passivation film even when no passivation film is separated.

However, in the conventional technique, the image becomes gray (intermediate color) with respect to the DC (direct current) signal and a signal having no change in potential from the previous time of timing to be observed. Therefore, no high/low potentials can be judged so that it is difficult to recognize the potential.

Further, in the conventional technique, the processing of taking in the potential contrast is performed every time the predetermined desirable test pattern signal is inputted while the test pattern is looped. Accordingly, it is necessary to set plural shots in which the potential contrast is taken in every time the test pattern is looped. The obtained plural potential contrasts were integrated, and the final potential contrast image was generated.

Accordingly, in the conventional technique, it takes time to generate the image of the potential contrast. As a result, a problem exists in that faulty or breakdown caused by process results cannot be rapidly analyzed.

In addition, in such a conventional technique, a problem exists in that no defective phenomenon having no repeating reproducibility can be observed.

BRIEF SUMMARY OF THE INVENTION

In consideration of the above problems, the present invention may provide an electron beam test system and an electron beam test method capable of obtaining potential information of the semiconductor integrated circuit device by observing one phenomenon, and judge high/low potentials with respect to the DC signal and a signal having no change in potential from the previous time of timing to be observed.

(1) One aspect of the present invention relates to an electron beam test system which obtains a potential contrast for analysis by irradiating an electron beam to a semiconductor integrated circuit device to be analyzed.

This electron beam test system comprises:

a tester which supplies a test pattern signal for analysis to the semiconductor integrated circuit device to be analyzed, and holds the test pattern signal at a given timing, and then changes a potential of a direct current power source of the semiconductor integrated circuit device to be analyzed and a potential of the held test pattern signal to a reference potential; and a detector which takes in the potential contrast right after the reference potential is set.

This electron beam system adopts a construction in which the test pattern signal in timing to be observed is held for a predetermined time, and this held test pattern signal (input signal) and the direct current power source potential are changed to the reference potential. When the held test pattern signal, etc. are changed to the reference potential, the signal to be observed can be detected as a differential waveform by adopting this construction even when this signal to be observed is a DC (direct current) signal and a signal having no change in potential from the previous time of timing to be observed.

As mentioned above, a high or low potential can be also judged with respect to the DC signal and the signal having no change in potential from the previous time of the timing to be observed.

In addition, in accordance with the present invention, a potential of a signal line can be detected as an attenuation signal on a passivation film. Therefore, the generation of a preferable potential contrast image can be realized by the observation of one phenomenon (the observation of a single shot phenomenon) without looping the test pattern signal.

Namely, the potential contrast image can be generated by observing the single shot operating phenomenon of the attenuation of a waveform. Therefore, it is possible to realize a system capable of simply obtaining potential information in the single shot observed from above the passivation film of the semiconductor integrated circuit device.

(2) This electron beam system may further include:
an electron gun which irradiates the electron beam to the semiconductor integrated circuit device to be analyzed; and
an analytical grid for observing a potential distribution, which is arranged between the electron gun and the semiconductor integrated circuit device to be analyzed.

(3) This electron beam system may further include a stage for placing the semiconductor integrated circuit device to be analyzed, and freely and horizontally movable.

(4) Another aspect of in the present invention relates to an electron beam test system which obtains a potential contrast for analysis by irradiating an electron beam to a semiconductor integrated circuit device to be analyzed.

This electron beam test system comprises:
a first stage for placing the semiconductor integrated circuit device to be analyzed;
a second stage for placing a non-defective semiconductor integrated circuit device for comparison with the semiconductor integrated circuit device to be analyzed;
a tester which supplies a test pattern signal for analysis to each of the semiconductor integrated circuit device to be analyzed and the non-defective semiconductor integrated circuit device, and holds the test pattern signal at a given timing, and then performs an operation of changing a potential of a direct current power source of each of the semiconductor integrated circuit device to be analyzed and the non-defective semiconductor integrated circuit device and a potential of the held test pattern signal to a reference potential;
a first detector which takes in the potential contrast of the semiconductor integrated circuit device to be analyzed right after the reference potential is set; and
a second detector which takes in the potential contrast of the non-defective semiconductor integrated circuit device right after the reference potential is set.

In accordance with this electron beam test system, the potential contrast of the semiconductor integrated circuit device to be analyzed can be compared with the potential contrast of the non-defective semiconductor integrated circuit device. Thus, an analytic time can be greatly shortened.

(5) This electron beam system may further include:
a first electron gun which irradiates the electron beam to the semiconductor integrated circuit device to be analyzed;
a second electron gun which irradiates the electron beam to the non-defective semiconductor integrated circuit device;
a first analytical grid for observing a potential distribution, which is arranged between the first electron gun and the first stage; and
a second analytical grid for observing the potential distribution, which is arranged between the second electron gun and the second stage.

(6) A further aspect of the present invention relates to an electron beam test system which obtains a potential contrast by irradiating an electron beam to a semiconductor integrated circuit device to be analyzed,
wherein a test pattern signal supplied to the semiconductor integrated circuit device to be analyzed is held at a given timing, and a potential of a direct current power source of the semiconductor integrated circuit device to be analyzed and a potential of the held test pattern signal are then changed to a reference potential, and the potential contrast of the semiconductor integrated circuit device to be analyzed right after the change is taken in.

(7) A still further aspect of the present invention relates to an electron beam test system which irradiates an electron beam to a semiconductor integrated circuit device to be analyzed and a non-defective semiconductor integrated circuit device for comparison with the semiconductor integrated circuit device to be analyzed, and obtains a potential contrast from each of the semiconductor integrated circuit device to be analyzed and the non-defective semiconductor integrated circuit device, the electron beam test system comprising:
holding a test pattern signal supplied to each of the semiconductor integrated circuit device to be analyzed and the non-defective semiconductor integrated circuit device at a given timing, and then performing an operation of changing a potential of a direct current power source of each of the semiconductor integrated circuit device to be analyzed and the non-defective semiconductor integrated circuit device and a potential of the held test pattern signal to a reference potential; and
taking in the potential contrast of the semiconductor integrated circuit device to be analyzed right after the reference potential is set, and taking in the potential contrast of the non-defective semiconductor integrated circuit device right after the reference potential is set.

(8) In the electron beam system according to these aspects of the present invention, the reference potential may be a ground potential.

Namely, when the potential of an electrode is changed from the high potential to the low potential (ground potential) on the actual passivation film, it is confirmed that the potential holding time of a subsequently generated attenuation waveform is approximately twice the hold time of the test pattern signal in comparison with the reverse case. Accordingly, a sufficiently long attenuation time can be obtained by setting the reference potential to the ground potential. The potential information can be obtained in more detail and faulty or breakdown caused by a process result of the semiconductor integrated circuit device can be more reliably detected by utilizing this sufficiently long attenuation period.

(9) The electron beam system according to these aspects of the present invention may include a beam control section which irradiates the electron beam to the semiconductor integrated circuit device as frame scan irradiation, and controls the electron beam so that the frame scan irradiation is performed during at least a hold period of the test pattern signal and a taking-in period of the potential contrast.

The potential of the passivation film surface of the surface of the semiconductor integrated circuit device is initialized by charging by frame-scan-irradiating the electron beam during the hold period of the supply test pattern signal. The attenuation waveform can be also reliably generated by frame-scan-irradiating the electron beam during the taking-in period of the potential contrast after the held signal potential is changed to the reference potential.

(10) The electron beam system according to these aspects of the present invention may include a contrast image generating section which sequentially takes in the potential contrast plural times during an attenuation period of the potential contrast right after the reference potential is set, and integrates a plurality of taken in potential contrasts in accordance with a given rule to generate a potential contrast image.

The potential of a signal line can be detected as a large attenuation signal on the passivation film by changing the held test pattern signal to the reference potential. Therefore, the present invention adopts a construction in which the potential contrast is sequentially taken in plural times during this attenuation period, and the plural taken in potential contrasts are integrated in accordance with the predetermined rule, and the potential contrast image is generated. Thus, the generation of a more preferable potential contrast image consistent in the strength of the potential contrast and an S/N ratio can be realized by the observation of a single shot phenomenon. Namely, it is possible to realize a system in which the single shot phenomenon of attenuation of a waveform is observed, and the potential information of the semiconductor integrated circuit device can be obtained simply and more reliably in the single shot observed from above the passivation film.

Further, in the electron beam system according to these aspects of the present invention, the potential contrast image may be generated by setting an integration ratio of the potential contrast taken in earliest to be greater than an integration ratio of the potential contrast taken in after the earliest potential contrast.

Thus, it is possible to optimize an image storing ratio to a memory means (e.g., frame memory) of the plural taken in potential contrasts. Accordingly, it is possible to generate the potential contrast image in which the potential contrast strength and the S/N ratio are further optimized.

(11) In the electron beam system according to these aspects of the present invention, timing for changing a potential of the direct current power source and a potential of the held test pattern signal to the reference potential and start timing of taking in the potential contrast may be determined in connection with a start of holding the supplied test pattern signal.

It is sufficient to firstly set the timing for changing the potential to the reference potential and the start timing of taking in the potential contrast only once by adopting the above construction. Thereafter, when the product kind of the semiconductor integrated circuit device to be analyzed is changed and the timing of the test pattern signal to be observed is further changed, it is not necessary to reset the timing for changing the potential to the reference potential and the start timing of taking in the potential contrast so that the entire system is very simply treated.

The following construction for generating the above trigger signal can be also adopted when it is assumed as one example of such a construction that a system portion for supplying the test pattern signal to the semiconductor integrated circuit device and a system portion for taking in the potential contrast by irradiating the electron beam to the semiconductor integrated circuit device are separately formed in hardware in the system.

In the system portion which supplies the test pattern signal, as one example of the above system, a trigger signal may be generated in connection with a start of holding the supplied test pattern signal, and a potential of the direct current power source and a potential of the held test pattern signal may be changed to the reference potential after a predetermined hold time has passed, and in the system portion for taking in the potential contrast, timing of vertical scanning for image taking-in may be reset after a predetermined delay time has passed from the generation of the trigger signal, and the potential contrast may begin to be taken in synchronously with timing of termination of a predetermined number of times of the vertical scanning after the reset, and the predetermined delay time may be set to a value at which timing of the termination of the predetermined number of times of the vertical scanning after the reset is conformed to timing of passing the hold time.

In the system portion which supplies the test pattern signal, as one example of the above system, a trigger signal may be generated in connection with a start of holding the supplied test pattern signal, and a potential of the direct current power source and a potential of the held test pattern signal may be changed to the reference potential after a predetermined hold time has passed, and in the system portion for taking in the potential contrast, timing of vertical scanning for image taking-in may be reset after a predetermined delay time has passed from the generation of the trigger signal, and the potential contrast may begin to be taken in, and the predetermined delay time may be set to a value at which timing for resetting the vertical scanning is conformed to timing of passing the hold time.

It is sufficient to firstly set the start timing of taking in the potential contrast only once in conformity with the generation of the trigger signal by adopting the above construction even in the system in which a system portion for supplying the test pattern signal to the semiconductor integrated circuit device and a system portion for taking in the potential contrast by irradiating the electron beam to the semiconductor integrated circuit device are separately formed in hardware. Further, thereafter, when the product kind of the semiconductor integrated circuit device to be analyzed is changed and the timing of the test pattern signal to be observed is further changed, it is not necessary to reset the timing for changing the potential to the reference potential and the start timing of taking in the potential contrast so that the entire system can be very simply treated.

(12) An even further aspect of the present invention relates to an electron beam test method, comprising:

holding a test pattern supplied to a semiconductor integrated circuit device to be analyzed for a predetermined time in timing to be observed, and then changing a direct current power source of the semiconductor integrated circuit device to be analyzed and the held test pattern signal to a reference potential, and irradiating an electron beam to the semiconductor integrated circuit device to be analyzed; and generating a potential contrast image for analyzing faulty or breakdown caused by a process defect by taking in the potential contrast right after the change to the reference potential.

(13) A yet further aspect of the present invention relates to an electron beam test method, comprising:

holding a test pattern supplied to a semiconductor integrated circuit device to be analyzed for a predetermined time in timing to be observed, and then changing a direct current power source of the semiconductor integrated circuit device to be analyzed and the held test pattern signal to a reference potential, and irradiating an electron beam to the semiconductor integrated circuit device to be analyzed, and holding the test pattern supplied to a non-defective semiconductor integrated circuit device for comparison with the semiconductor integrated circuit device to be analyzed for a predetermined time in timing to be observed, and then changing a direct current power source of the non-defective semiconductor integrated circuit device and the held test pattern signal to the reference potential, and irradiating the electron beam to the non-defective semiconductor integrated circuit device; and generating a potential contrast image of each of the semiconductor integrated circuit device to be analyzed and the non-defective semiconductor integrated circuit device by taking in the potential contrast of each of the semiconductor integrated circuit device to be analyzed and the non-defective semiconductor integrated circuit device right after the change to the reference potential, and analyzing faulty or breakdown caused by a process defect of the semiconductor integrated circuit device to be analyzed by comparing the potential contrast image of each of the semiconductor integrated circuit device to be analyzed and the non-defective semiconductor integrated circuit device.

(14) The electron beam test method according to these aspects of the present invention may include irradiating the electron beam to the semiconductor integrated circuit device as frame scan irradiation, and performing the frame scan irradiation during at least a hold period of the test pattern signal to be supplied and a taking-in period of the potential contrast.

(15) The electron beam test method according to these aspects of the present invention may include sequentially taking in the potential contrast plural times during an attenuation period of the potential contrast right after the reference potential is set, and integrating a plurality of taken in potential contrasts in accordance with a given rule to generate a potential contrast image.

(16) Further, in these aspects of the present invention, the semiconductor integrated circuit device may be analyzed in a state of simplex. The semiconductor integrated circuit device may be analyzed in a state of a semiconductor wafer in which the semiconductor integrated circuit device is formed. Further, the semiconductor integrated circuit device may be analyzed in the both states.

(17) Further, in these aspects of the present invention, a potential of the direct current power source of the semiconductor integrated circuit device and a potential of the test pattern signal may be directly changed to the reference potential without holding the test pattern signal in timing in which the test pattern signal supplied to the semiconductor integrated circuit device becomes a test pattern signal to be observed, and the potential contrast may be taken in right after the change to the reference potential.

BRIEF DESCRIPTION OF THE SEVERAL VIEWS OF THE DRAWING

FIGS. 3A to 3E illustrate the mechanism of potential contrast generation, FIG. 3A is a sectional view showing one portion of a semiconductor integrated circuit device for obtaining a potential contrast, FIGS. 3B and 3D are equivalent circuit diagrams of the semiconductor integrated circuit device shown in FIG. 3A, and FIGS. 3C and 3E show differential waveforms generated on the surface of the passivation film of FIG. 3A;

FIG. 8 is a timing chart showing a test pattern signal, hold of the test pattern signal and timing of the image taking-in;

FIG. 9A illustrates the timing of the image taking-in, FIG. 10 illustrates another example of the timing chart showing the test pattern signal, the hold of the test pattern signal and the timing of the image taking-in.

DETAILED DESCRIPTION OF THE EMBODIMENT

The embodiment modes of the present invention will next be explained with reference to the drawings.

1. Entire Configuration of the System

Figure 1:
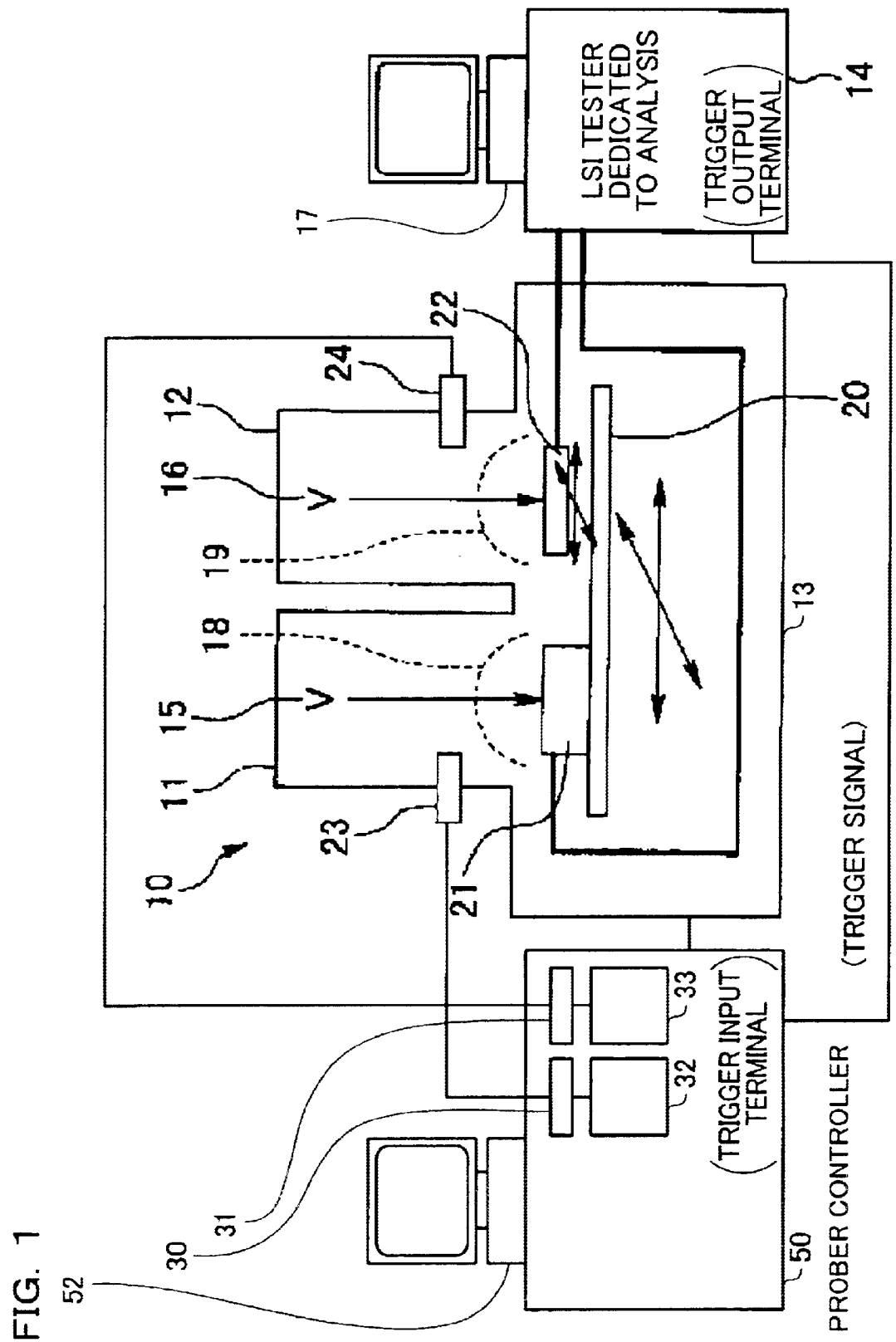
FIG. 1 illustrates a process electron beam test system of an embodiment mode of the present invention.

FIG. 1 is a constructional view showing a process electron beam test system in an embodiment mode of the present invention.

This process electron beam test system is a dedicated electron beam test system for analyzing faulty and breakdown caused by a process defect in the semiconductor integrated circuit device of a CMOS static operation.

The system of this embodiment mode is formed such that this system can analyze the semiconductor integrated circuit device in a simplex state, and can also analyze the semiconductor integrated circuit device in the state of a semiconductor wafer forming the semiconductor integrated circuit device therein. In accordance with necessity, the system may be also formed such that this analysis is made only in the simplex case of the semiconductor integrated circuit device. Further, conversely, the system may be also formed such that this analysis is made only in the state of the semiconductor wafer forming the semiconductor integrated circuit device therein.

The process electron beam test system 10 has an electron beam prober 13, an analysis dedicated LSI tester 14 for operating a device connected to this electron beam prober 13, a control personal computer 17 for controlling operations of the electron beam prober 13 and the analysis dedicated LSI tester 14, a prober controller 50 for the electron beam prober, and a prober control personal computer 52 for controlling an operation of the prober controller 50.

The electron beam prober 13 has first and second mirror bodies 11, 12. Thermal W-Guns 15, 16 for irradiating the electron beam are arranged on the respective upper sides of the first and second mirror bodies 11, 12. Analytical grids 18, 19 for observing a potential distribution and measuring a waveform are arranged on the respective lower sides of the first and second mirror bodies 11, 12.

An X-Y moving common stage 20 located below the first and second mirror bodies 11, 12 are arranged within the electron beam prober 13. In this stage 20, a fixing stage 21 located below the first mirror 11 is arranged and an X-Y moving stage 22 located below the second mirror body 12 is arranged.

A non-defective semiconductor integrated circuit device for comparison is set to the fixing stage 21. A semiconductor integrated circuit device for measurement (defective) is set to the X-Y moving stage 22. The stages for setting the non-defective and the defective may be reversely set.

In accordance with necessity, the semiconductor wafer forming the non-defective semiconductor integrated circuit device therein may be placed on the fixing stage 21, and the semiconductor wafer forming the defective semiconductor integrated circuit device therein may be also placed on the X-Y moving stage 22, and these semiconductor wafers may be also operated by the LSI tester 14 similarly to the above case.

A secondary electron detector 23 is arranged in the vicinity of the fixing stage 21, and a secondary electron detector 24 is arranged in the vicinity of the X-Y moving stage 22.

The semiconductor integrated circuit device for measurement and the non-defective semiconductor integrated circuit device are respectively connected to the analysis dedicated LSI tester 14.

The analysis dedicated LSI tester 14 operates the non-defective/defective semiconductor integrated circuit devices. Specifically, these semiconductor integrated circuit devices are operated by supplying a test pattern signal shown in FIG. 8 and a voltage VDD from a direct current power source to the semiconductor integrated circuit device as an object.

At this time, the supplied voltage of the direct current power source is set to the power potential VDD. In addition, the supplied test pattern signal is supplied as a combination (a combination of high and low signals in voltage) of plural signals from each input terminal in synchronization with a clock signal. Here, a case in which the test pattern signal is sequentially supplied as a combination of four signal waveforms is exemplified.

In the semiconductor integrated circuit device, no high speed clock is required when faulty and breakdown caused by process results are analyzed. Therefore, a low speed clock is used in the tester 14 of the embodiment. Further, since no high timing accuracy is required in the signal waveform, the tester 14 of this embodiment mode is formed as a tester for only a process defect. As this result, the system of this embodiment is simply constructed and cheaply manufactured.

The non-defective semiconductor integrated circuit device is prepared and is placed on the fixing stage 21. The defective semiconductor integrated circuit device as an object to be analyzed is also prepared and is placed on the X-Y moving stage 22. These semiconductor integrated circuit devices are connected to the analysis dedicated LSI tester 14, and are operated by this LSI tester 14 as mentioned above.

An electron beam is irradiated by the thermal W-Guns 15, 16, and is frame-scanned and irradiated to the operated semiconductor integrated circuit device. A secondary electron from the semiconductor integrated circuit device is detected by the secondary electron detectors 23, 24 through the analytical grids 18, 19, and a potential contrast is obtained. The non-defective and defective potential contrasts are compared with each other in real time by using the electron beam prober having the first and second mirror bodies. Thus, the defective semiconductor integrated circuit device can be analyzed.

As mentioned above, A/D converters 30, 31 and frame memories 32, 33 are arranged in the prober controller 50 of this embodiment mode to obtain the potential contrast and generate the potential contrast image. A potential contrast signal detected by the secondary electron detectors 23, 24 is converted to a digital signal by the corresponding A/D converters 30, 31, and are written to the frame memories 32, 33. At this time, the prober control personal computer 52 and the prober controller 50 function as an electron beam control section for controlling the electron beam irradiation to the semiconductor integrated circuit device using the thermal W-Guns 15, 16 and the analytical grids 18, 19, and also function as a contrast image generating section together with the secondary electron detectors 23, 24, the A/D converters 30, 31 and the frame memories 32, 33.

2. Hold and Image Taking-in

Figure 2:
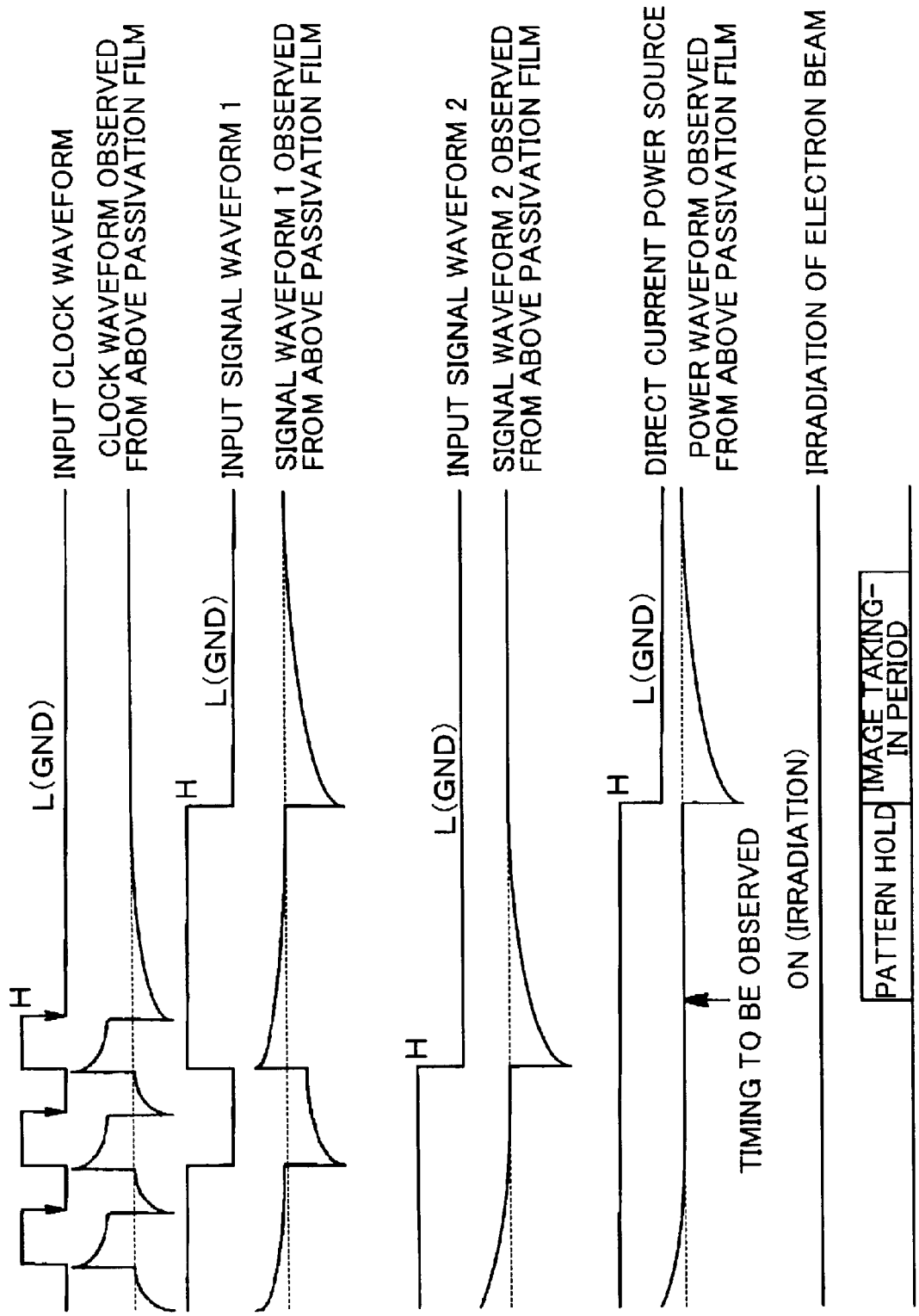
FIG. 2 shows one example of each of a clock waveform of wiring, a clock waveform observed from above a passivation film, an input signal waveform, an input signal waveform observed from above the passivation film, a power waveform, and a power waveform observed from above the passivation film.
Figure 4:
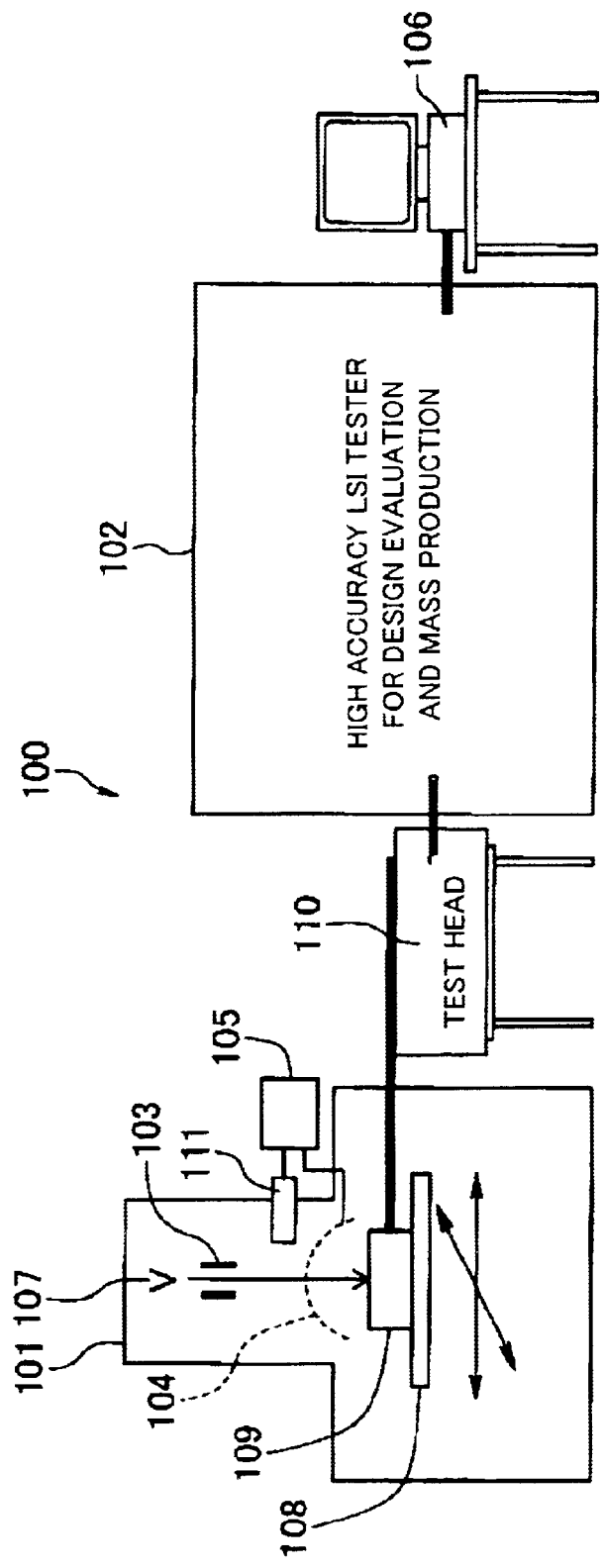
FIG. 4 illustrates the conventional electron beam test system.
Figure 5:
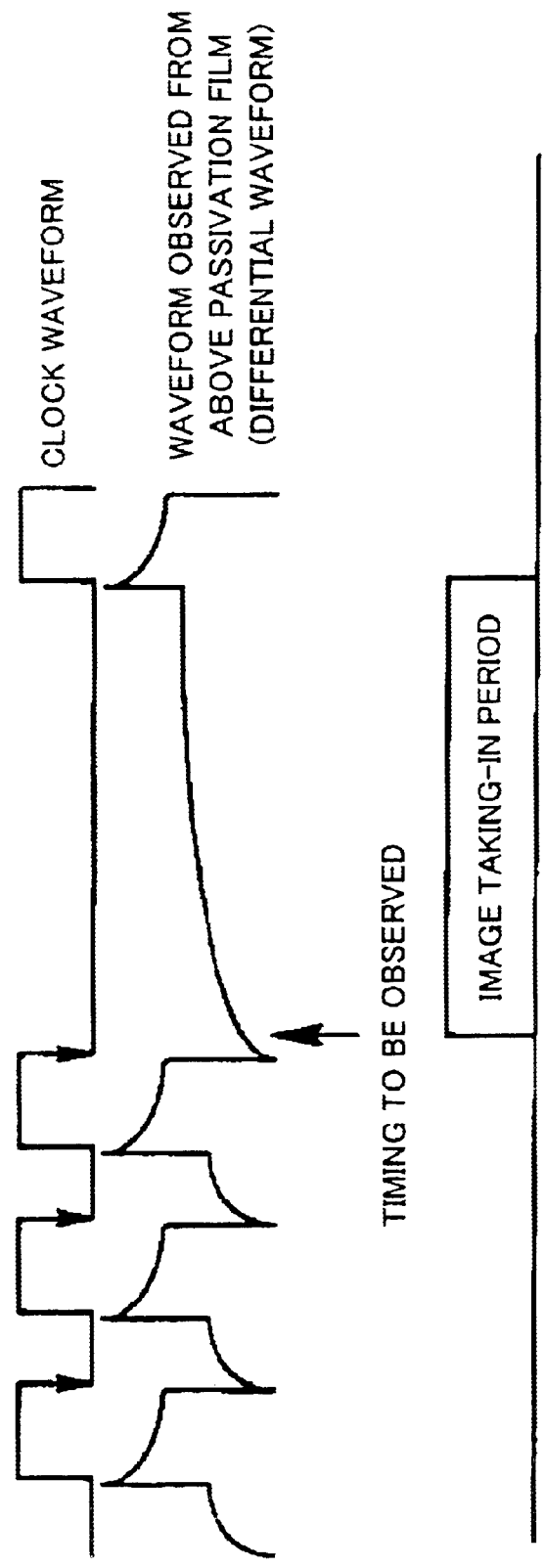
FIG. 5 illustrates the clock signal waveform of wiring and the differential waveform appearing on the passivation.

FIG. 2 shows a concrete example of each waveform in the semiconductor integrated circuit device. Here, FIG. 2 shows one example of a clock waveform of wiring, a clock waveform observed from above the passivation film, an input signal waveform, an input signal waveform observed from above the passivation film, a direct current power waveform, and a direct current power waveform observed from above the passivation film.

The test pattern signal of the same type is supplied to each of the non-defective and defective semiconductor integrated circuit devices, and each of the non-defective and defective semiconductor integrated circuit devices is operated in a state in which the voltage of a direct current power source is supplied.

As shown in FIG. 2, the test pattern signal is held for a predetermined time (e.g., about 5 seconds) in timing to be observed (timing in which the test pattern signal to be observed is inputted). The potential contrast is taken in for a predetermined time (e.g., about 1 second) right after the potential of the direct current power source and the input signal (test pattern signal) are changed to a reference potential (e.g., ground potential (GND)) at high speed.

The frame scan irradiation of the electron beam with respect to the semiconductor integrated circuit device is performed during at least a hold period of the test pattern signal and a taking-in period of the potential contrast.

The test pattern signal is held for the predetermined time to sufficiently charge and initialize electrons in the passivation film by the frame scan irradiation of the electron beam.

The potential (e.g., high level) of each signal line can be detected as a predetermined differential waveform on the passivation film by changing the potential of the direct current power source and the test pattern signal to the reference potential at high speed.

When faulty can be reproduced by only a high speed signal and no potential at a time to be observed can be held by a chip internal delay circuit, the potential of the power voltage and the input signal may be changed to the reference potential, e.g., GND at high speed right after timing to be observed without arranging the hold period, and the potential contrast may be also similarly taken in right after this change.

FIGS. 3A to 3E explain the mechanism of potential contrast generation.

FIG. 3A is a sectional view showing one portion of the semiconductor integrated circuit device for obtaining the potential contrast. As shown in FIG. 3A, a passivation film 26 is formed on an Al alloy wiring 25. The electron beam is irradiated to this passivation film 26 by the thermal W-Guns 15, 16 shown in FIG. 1. The test pattern signal is held for a predetermined time at a time to be observed. Right after the potential of the held signal and the potential of the direct current power source are changed to the reference potential, e.g., the GND at high speed, the potential contrast is taken in for a predetermined time. At this time, for example, it has been confirmed that a differential waveform as shown in FIG. 3C is generated only when the potential of the held signal has a high level.

The test pattern signal will next be explained in detail by dividing the test pattern signal supplied and held in the Al alloy wiring 25 into the cases of the high and low levels.

First, in a state in which the test pattern signal at the high level is supplied to the Al alloy wiring 25, it is assumed that this input signal is held. FIG. 3B is an equivalent circuit diagram showing the semiconductor integrated circuit device in simulation in this state. FIG. 3C is a view showing the waveform of a surface potential Vs of the passivation film 26 in this state.

When the high level signal is supplied to the Al alloy wiring 25, the hold of this signal is equivalent to the setting of a switch onto a turning-on side in the equivalent circuit of FIG. 3B. Therefore, it is observed that the surface potential Vs of the passivation film 26 becomes the ground potential (GND) as shown in FIG. 3C.

The potential of the direct current power source and the potential of the held input signal are changed to the reference potential (here the ground potential) at high speed. This change in potential is equivalent to turning-off of the switch in the equivalent circuit of FIG. 3B. As shown in FIG. 3C, it has been confirmed that the surface potential Vs of the passivation film 26 is observed as a differential waveform.

Next, it is assumed that the pattern signal at a low level is supplied to the Al alloy wiring 25 shown in FIG. 3A. FIG. 3D is an equivalent circuit diagram of the semiconductor integrated circuit device in this state. FIG. 3E shows the surface potential Vs of the passivation film 26 in this state.

A holding state of the test pattern signal at the low level is equivalent to the turning-on state of the switch in the equivalent circuit shown in FIG. 3D. The surface potential Vs of the passivation film 26 is observed as a signal at the low level as shown in FIG. 3E.

In this state, the potential of the direct current power source and the held input signal are changed to the reference potential, here, the ground potential at high speed. Such a change in potential is equivalent to the turning-off of the switch in FIG. 3D, but the signal level of the Al alloy wiring 25 is subsequently the low level Therefore, as shown in FIG. 3E, the surface potential Vs of the passivation film 26 is subsequently the low level as it is, and is not changed.

Thus, in the system of this embodiment mode, the test pattern signal supplied to the semiconductor integrated circuit device is held for a predetermined time in timing to be observed. The potential Vs on the passivation film 26 on the Al alloy wiring 25 supplying the signal at the low level thereto is not changed and is detected as the signal at the low level by changing the test pattern signal to the reference potential at high speed. However, the surface potential Vs of the passivation film 26 on the Al alloy wiring 25 supplying the signal at the high level thereto is observed as a differential waveform in a minus potential direction shown in FIG. 3C. If the signal supplied to the Al alloy wiring 25 is a signal at the high level, this differential waveform is reliably generated even when this supplied signal is a DC signal and a high level signal having no change in potential from the previous time of timing to be observed.

As mentioned above, in the system of this embodiment mode, it is possible to detect whether the potential of the signal of the Al alloy wiring 25 is high or low by observing the signal of the potential Vs observed on the surface of the passivation film 26 on the Al alloy wiring 25. In particular, the signal of the Al alloy wiring 25 can be reliably detected even when this signal is the DC signal unable to be observed in the conventional system and is a signal such as a high level signal having no change in potential from the previous information of timing to be observed.

Specifically, a clock waveform and a signal waveform changed in potential can be obtained as a potential contrast. In addition to this, the potential change due to the differential waveform is caused and it is possible to judge whether this potential level is high or low with respect to the direct current signal and the signal having no change in potential before and after the timing to be observed.

Further, in accordance with this embodiment mode, the potential of a signal line can be detected as a large attenuation signal on the passivation film by changing the held test pattern signal, etc. to the reference potential. Therefore, the generation of a more preferable potential contrast image consistent in strength of the potential contrast and an S/N ratio can be realized by one observation (observation of a single shot phenomenon) for obtaining an image by adopting a construction in which the potential contrast is sequentially taken in plural times during this attenuation period and the plural taken in potential contrasts are integrated in accordance with a predetermined rule and the potential contrast image is generated.

Namely, in the conventional system, it is necessary to set plural shots in which the test pattern signal is repeatedly inputted to the semiconductor integrated circuit device, and the potential contrast is repeatedly taken in every time a predetermined desirable test pattern is inputted. The plural potential contrasts obtained in this way were integrated and the final potential contrast image was generated. Accordingly, it takes time to generate the potential contrast image, and the potential contrast in each loop must be obtained while synchronization is performed in optimum timing in the looped test pattern. Therefore, the entire system was inevitably complicated and expensive, and such matters became an inducement causing an analysis error. Further, no defective phenomenon having no repeating reproducibility could be analyzed in the conventional system.

In contrast to this, in the system of this embodiment mode, as mentioned above, it is possible to realize a system in which the single shot operating phenomenon of attenuation of a waveform is observed and potential information can be simply and reliably obtained in a single shot observed from above the passivation film of the semiconductor integrated circuit device Accordingly, in the system of this embodiment mode, the potential contrast image can be generated for a short time, and this system can be simply constructed and cheaply manufactured. Further, it is also possible to analyze the defective phenomenon having no repeating producibility, which cannot be analyzed in the conventional system. Furthermore, an analytic error is reduced in comparison with the conventional system so that analytic accuracy can be raised.

In particular, in this embodiment mode, since the potential contrast is taken in plural times during the attenuation period, it is possible to obtain the potential contrast image having a higher S/N ratio and a sufficient potential contrast strength.

In the generation of the above potential contrast image, it is preferable to adopt a construction in which an integration ratio of the most previously taken in potential contrast is set to be greater than that of the subsequently taken in potential contrast.

Thus, an image storing ratio of the potential contrasts taken into the frame memory plural times can be optimized, and it is possible to generate the potential contrast image in which the potential contrast strength and the S/N ratio are further optimized.

Further, in the system of this embodiment mode, it is preferable to adopt a construction in which timing for changing the potential of the above direct current power source and the potential of the above held test pattern signal to the reference potential, and start timing of taking in the above potential contrast are determined in connection with the hold start of the above supply test pattern signal.

It is sufficient to firstly set the timing for changing the potential to the reference potential and the start timing of taking in the potential contrast only once by adopting the above construction. Thereafter, it is not necessary to reset the timing for changing the potential to the reference potential and the start timing of taking in the potential contrast even when the product kind of the semiconductor integrated circuit device as an object to be analyzed is changed and the timing of the test pattern signal to be observed is further changed. Accordingly, the entire system is very simply treated and a preparing time of the analysis is greatly shortened and a rapid defective analysis can be realized.

In this embodiment mode, the non-defective and defective potential contrasts can be compared with each other in real time by using the electron beam prober having the first and second mirror bodies so that the analytic time can be greatly shortened. In contrast to this, it was necessary to replace and measure the non-defective and the defective in the conventional electron beam test system.

Further, in the embodiment mode, the two mirror bodies 11, 12 are used, but the system is reduced in cost by reducing manufacture cost of the individual mirror bodies and further setting the operating speed of the analysis dedicated LSI tester to a low speed. Therefore, the reduction in cost of the entire system can be realized. The conventional electron beam test system is very expensive, but low cost is realized in the process electron beam test system in this embodiment mode.

Namely, the process electron beam test system in this embodiment mode is a dedicated electron beam test system for analyzing faulty and breakdown caused by a process defect. Accordingly, it is not necessary to cope with a speed margin defect often caused by a design defect. Further, high and low judgments can be made even in a signal having no change in potential close to the DC. Therefore, since it can be unnecessary to arrange a waveform measuring function which was provided with the conventional electron beam tester, it is unnecessary to arrange abeam blanker-waveform measuring unit for measuring a high speed waveform. Further, it is also unnecessary to arrange the analytical grid when the potential contrast is obtained by utilizing a first kind local electric field effect. Further, since it is not necessary to change the electron beam to a pulse, it is not necessary to use the FE-Gun of high brightness so that no high degree low vacuum plant (turbo molecule ion pump, etc.) for this FE-Gun is also required. Accordingly, low cost can be realized as the entire system.

The operating effects of the system of this embodiment mode explained above, particularly, the system of this embodiment mode capable of realizing the image obtaining of a single shot are summarized as follows:

a: It is possible to observe the defective phenomenon having no repeating reproducibility.

b: It is very easy to set and operate the LSI tester since no test pattern signal is looped.

c: As a result of the above b, the analysis can be made even when no operator knows the operation of the LSI tester well.

d: As a result of the above b, an analysis preparing period is shortened, and an analytic speed can be improved.

e: As a result of the above b, the analysis preparing period is reduced and analytic accuracy can be raised.

3. Example of System of Embodiment

The electron beam test system in this embodiment mode will next be explained in more detail.

3.1. Frame Scan

Figure 6:
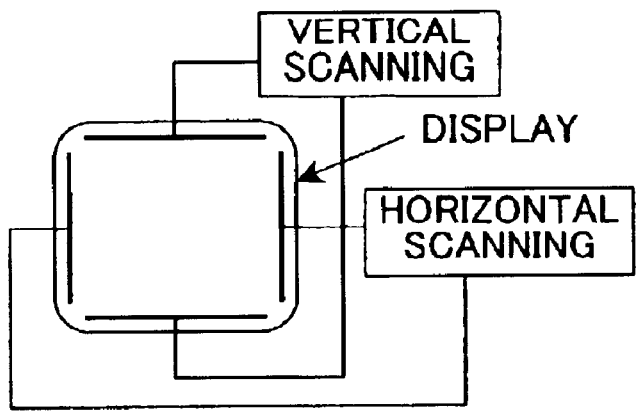
FIG. 6 illustrates a frame scan for taking in an image.
Figure 7:
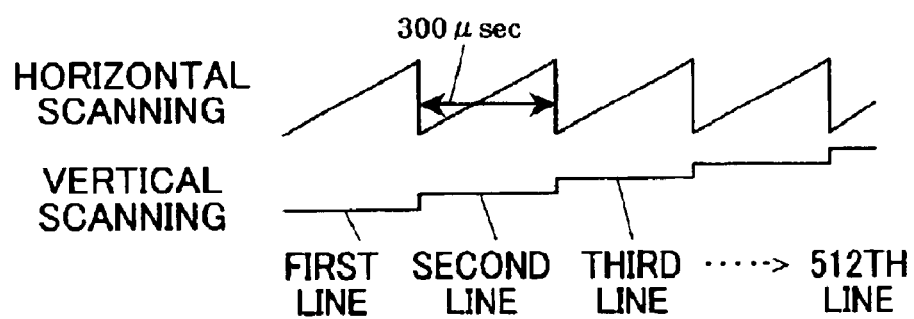
FIG. 7 illustrates horizontal and vertical scans.

First, the construction of the frame scan for obtaining the potential contrast will be explained. FIG. 6 shows a display and its electrostatic deflection plate. FIG. 7 shows a saw-tooth-wave of horizontal scanning and a stepped wave of vertical scanning.

When a first saw-tooth-wave is applied to the left-hand and right-hand deflection plates of the display by a horizontal scanning circuit, a scanning line is scanned from left to right and is again returned to the original position. In a state in which one scanning line is transversally scanned to a display uppermost portion, a time required for the scanning is e.g., 300 $\mu$sec.

When a second saw-tooth-wave is applied, a (second) signal advanced by one step with respect to the stepped wave of the vertical scanning is emitted from a vertical scanning circuit. The second scanning line is scanned to a position moved by one step on the lower side from the previous first scanning line.

In a moment in which one scanning line is scanned from left to right by one saw-tooth-wave and is again returned to the original position, its detailed position accurately becomes a position moved by one step to the lower side from the first scanning line. For example, the vertical scanning line is stepped waves of 512 steps. Thus, the 512 scanning lines are scanned so that one screen (one frame) is constructed.

In this case, a time required to draw one frame becomes as follows;

$$300 \,\mu\text{sec.} \times 512 = 153.6 \text{ msec.}$$

In this embodiment mode, the above frame scan of the display is perfectly performed in synchronization with the frame scan irradiation of a primary electron beam performed with respect to the surface of a sample (LSI chip) within the electron beam prober.

The horizontal scanning is shown by the saw-tooth-wave, but is shown by a stepped wave if it is digital scan. The stepped wave of the vertical scanning is shown by a saw-tooth-shape in the subsequent explanatory view.

3.2. Taking in of Potential Contrast

In the system of this embodiment mode, the test pattern is held while the electron beam is frame-scanned and irradiated. After the potential of the surface of the passivation film is initialized, the signal potentials from all testers 14 including a power source (VDD GND) are changed to the GND potential. Right after this change, only the image frame-scanned as mentioned above is taken in as a potential image.

In the system of this embodiment mode, when a system portion such as the LSI tester 14 for supplying the test pattern signal and a system portion such as the electron beam prober 13 and the prober controller 50 for taking in the potential contrast are separately formed in hardware, it is necessary to construct the system such that the test pattern signal is held and the held test pattern signal is changed to the reference potential and the frame-scanned potential image is taken in while both the system portions are preferably synchronized with each other in consideration of internal delay of both the system portions, etc.

Figure 8:
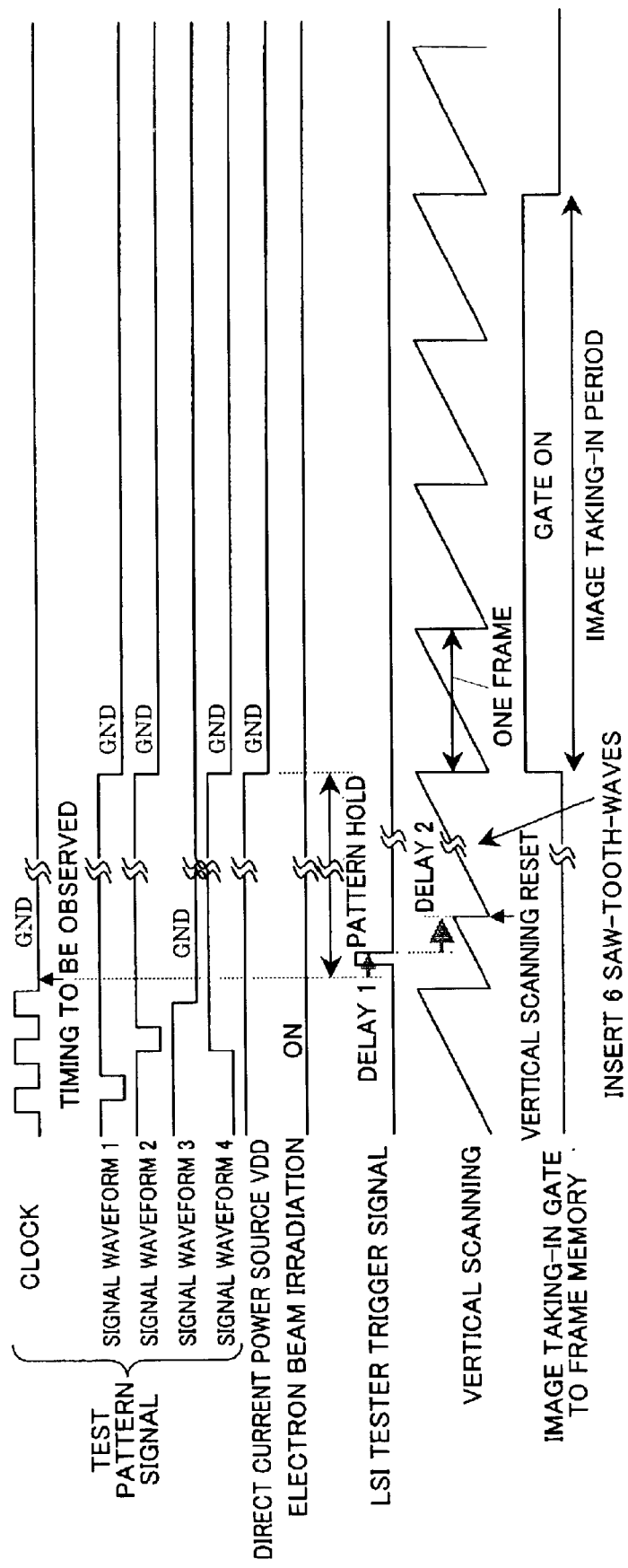

Therefore, in the system of this embodiment mode, as shown in FIG. 8, a trigger signal is generated in connection with a hold start of the above supply test pattern signal. After a predetermined hold time has passed, the potential of the above direct current power source and the potential of the above held test pattern signal are changed to the reference potential.

After a predetermined delay time (a time of delay 2 of FIG. 8) has passed from the generation of the above trigger signal, timing of the vertical scanning for image taking-in is reset. After this reset, the above potential contrast begins to be taken in synchronously with the timing of termination of a predetermined number of times of the vertical scanning.

Here, the above predetermined delay time (time of delay 2) is set to a value at which the timing of the termination of the predetermined number of times of the vertical scanning after the above reset is conformed to the timing of the passage of the above hold time.

Its concrete example will next be shown along FIG. 8.

First, the LSI tester 14 holds a test pattern, and a trigger signal is then outputted from the LSI tester 14 to the prober controller 50.

The prober controller 50 resets timing of the vertical scanning for image taking-in on the basis of this trigger signal. After this reset, timing in each circuit portion is adjusted so as to start the taking in of the potential contrast in synchronization with the timing of the termination of a predetermined number of times (here 6 times) of the vertical scanning.

Here, the timing is adjusted so as to obtain the potential image on the side of the prober controller 50 just after the tester 14 changes the signal potential power applied to a sample (LSI chip) to the GND.

With respect to the LSI tester 14, it is assumed that an internal delay 1 of the system from the hold of the test pattern to the output of the trigger signal is fixedly set to 30 msec, and a time required for the hold of the test pattern is set to 1 sec, and six saw-tooth-waves of the vertical scanning are inserted during this pattern hold (frame-scanned six times). The time of an internal delay 2 required from the input of the trigger signal to the prober controller 50 to the reset of the timing of the vertical scanning for image taking-in actually performed by this prober controller 50 is adjusted to 48.4 msec from the following formula:

{1 sec.−30 msec−(153.6 msec×6)}=48.4 msec.

When the vertical scanning after the reset is terminated 6 times, the potential contrast image begins to be taken into the frame memory as shown in FIG. 8.

The image is taken in by four frames in the example of FIG. 8. The frame scan is performed at any time, and the electron beam is irradiated as it is at any time. However, the image taken into the frame memory is constructed by only the amount of four frames in predetermined timing.

In the system of this embodiment mode shown in FIG. 8, if the adjustment of this delay 2 is first executed only once, the condition from the hold of the test pattern to the image taking-in is fixed. Therefore, there is an advantage in that it is not necessary to change the setting even when a clock rate, etc. are changed by changing the timing to be observed and an analytic object product kind (product kind of the LSI chip).

A modified example of the system shown in FIG. 8 will next be explained on the basis of FIG. 10.

Figure 10:
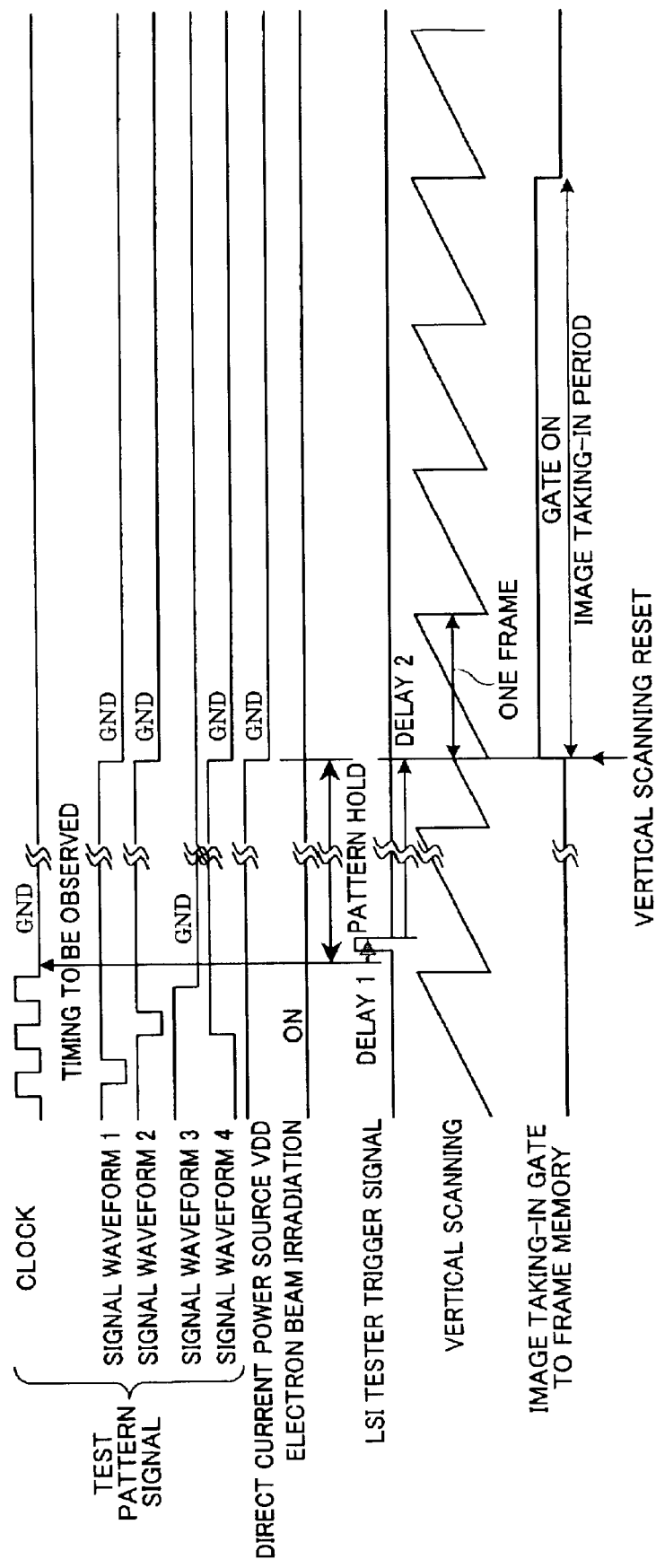

As shown in FIG. 10, in the system of the embodiment mode in this modified example, the tester 14 generates a trigger signal in synchronization with the start of the hold of the supply test pattern signal after a predetermined internal delay time (delay 1) has passed. After a predetermined hold period (here 1 sec) has passed, the tester 14 changes the potential of the held test pattern signal and the potential of the direct current power source to the GND as a reference potential.

The prober controller 50 inputting the above trigger signal thereto resets timing of the vertical scanning for image taking-in after a predetermined delay time (a time corresponding to the delay 2 of FIG. 10) has passed from the generation of the trigger signal. Further, the prober controller 50 begins to take in the potential contrast.

Here, the time of the above delay 2 is set to a value at which the timing for resetting the vertical scanning is conformed to the timing of the passage of the hold time.

Similar to the embodiment mode shown in FIG. 8, if the adjustment of the delay 2 is executed first only once even when such a construction is adopted, operating effects similar to those in the embodiment mode shown in FIG. 8 can be obtained since the condition from the hold of the test pattern to the image taking-in is fixed.

3.3. Integration of Potential Contrast

A procedure for obtaining the potential contrast will next be explained on the basis of FIGS. 9A and 9B.

Figure 9A:
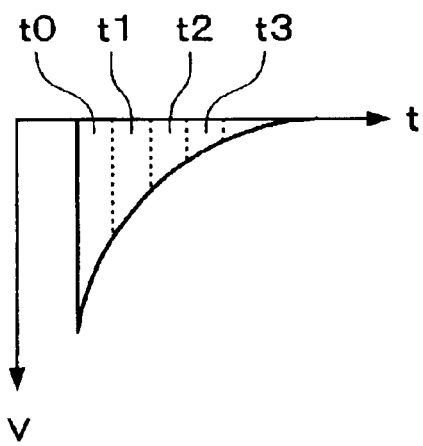
Figure 9B:
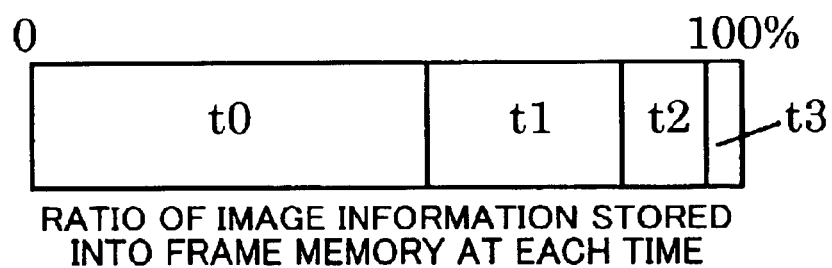
FIG. 9B illustrates processing when plural taken in potential contrast images are integrated.

As shown in FIG. 9A, the potential contrast appearing on the passivation film is exponentially reduced (discharge waveform).

In this figure, the axis of ordinate shows V (voltage), and the axis of abscissa shows t (time).

This is represented by the following formula (the formula of a differential circuit discharge voltage).

$$Vt = V0 \cdot \epsilon^{-t/(CR)}$$

Here, Vt: voltage at time t, V0: initial voltage, $\epsilon$: base of natural logarithm, t: time, C: capacity of passivation film, and R: resistance value with respect to GND electrode from insulating film surface are set.

An image obtaining period is first conformed to a potential holding period to more effectively obtain potential information having such a behavior and realize the observation (observation made by one image obtaining) of a single shot phenomenon. An image signal obtained at t=0 providing large V(t) is stored to the frame memory in a largest ratio. Thereafter, the integration of the image is advanced while the ratio of the image signal stored to the frame memory is gradually reduced with the passage of time. In other words, for example, when the time axis is divided into four times t0 to t3 in the discharge waveform of the above view, an image obtaining storage ratio to the frame memory at each time is set as shown in FIG. 9B.

Thus, the potential contrast can be effectively obtained by changing the ratio of the image signal stored to the frame memory in accordance with the strength of the potential contrast while the S/N of the image is secured.

A concrete example of the image integration method of this embodiment mode will next be shown.

A case in which the potential contrast signal (Vt/V0≈0.1) is divided into four and obtained until a time at which Vt (voltage at time t) is attenuated to about 10% of V0 (initial voltage) will be explained as an example.

Since Vt/V0≈0.1 is set when T/(CR)=2.1, the potential contrast signal until this time is taken in by equally dividing the time into four. Vt/V0 at each time (t0 to t3) is provided as follows.

$$Vt/V0=\{V0\cdot\epsilon^{-t/(CR)}\}/V0=\epsilon^{-t/(CR)}$$

t0: $\epsilon^{-0}=1.00$
t1: $\epsilon^{-0.7}=0.50$
t2: $\epsilon^{-1.4}=0.25$
t3: $\epsilon^{-2.1}=0.12$ When the image storing ratio to the frame memory is determined in proportion to the magnitude of the potential at each time, the following values are obtained.

t0: 1.00/(1.00+0.50+0.25+0.15+0.12)=0.54
t1: 0.50/(1.00+0.50+0.25+0.15+0.12)=0.27
t2: 0.25/(1.00+0.50+0.25+0.15+0.12)=0.13
t3: 0.12/(1.00+0.50+0.25+0.15+0.12)=0.06

Namely, the image signal at time t0 providing a large potential contrast (Vt) is stored to the frame memory in a highest ratio of 54%, and this storing ratio is reduced as V(t) is reduced.

Thus, in the system of this embodiment mode, the image is sequentially taken in plural times during the attenuation period of the potential contrast. The integration ratio of the most previously taken in potential contrast is set to be greater than that of the subsequently taken in potential contrast, and the potential contrast image is generated. Thus, the image storing ratio to the frame memory at each time can be optimized, and it is possible to generate a preferable potential contrast image consistent in the potential contrast strength and the S/N ratio.

The present invention is not limited to the above embodiment mode, but can be variously changed and embodied.

For example, in this embodiment mode, the ground potential is used as the reference potential, and the test pattern signal supplied to the semiconductor integrated circuit device is held for a predetermined time in timing to be observed. Thereafter, the potential of the direct current power source and the held test pattern signal are changed to the ground potential as an example. However, the present invention is not limited to this example. In accordance with necessity, the system may be also formed such that other reference potentials, e.g., the power potential, an intermediate potential, etc. are used as the reference potential in accordance with necessity.

What is claimed is:

1. An electron beam test system which obtains a potential contrast for analysis by irradiating an electron beam to a semiconductor integrated circuit device to be analyzed, the electron beam test system comprising:

a tester which supplies a test pattern signal for analysis to the semiconductor integrated circuit device to be analyzed, and holds the test pattern signal at a given timing, and then changes a potential of a direct current power source of the semiconductor integrated circuit device to be analyzed and a potential of the test pattern signal that is held to a reference potential; and a detector which takes in the potential contrast right after the reference potential is set.

2. The electron beam test system as defined in claim 1, further comprising:

an electron gun which irradiates the electron beam to the semiconductor integrated circuit device to be analyzed; and an analytical grid for observing a potential distribution, which is arranged between the electron gun and the semiconductor integrated circuit device to be analyzed.

3. The electron beam test system as defined in claim 2, further comprising:

a stage for placing the semiconductor integrated circuit device to be analyzed, and freely and horizontally movable.

4. The electron beam test system as defined in claim 1, wherein the reference potential is a ground potential.

5. The electron beam test system as defined in claim 1, comprising:

a beam control section which irradiates the electron beam to the semiconductor integrated circuit device to be analyzed as frame scan irradiation, and controls the electron beam so that the frame scan irradiation is performed during at least a hold period of the test pattern signal and a taking-in period of the potential contrast.

6. The electron beam test system as defined in claim 1, further comprising:

a contrast image generating section which sequentially takes in the potential contrast plural times during an attenuation period of the potential contrast right after the reference potential is set, and integrates a plurality of taken in potential contrasts in accordance with a given rule to generate a potential contrast image.

7. The electron beam test system as defined in claim 6, wherein the potential contrast image is generated by setting an integration ratio of the potential contrast taken in earliest to be greater than an integration ratio of the potential contrast taken in after the earliest potential contrast.

8. The electron beam test system as defined in claim 1, wherein timing for changing a potential of the direct current power source and a potential of the held test pattern signal to the reference potential and start timing of taking in the potential contrast are determined in connection with a start of holding the test pattern signal.

9. The electron beam test system as defined in claim 8, wherein a trigger signal is generated in connection with a start of holding the test pattern signal, and a potential of the direct current power source and a potential of the test pattern signal that is held are changed to the reference potential after a predetermined hold time has passed, wherein timing of vertical scanning for image taking-in is reset after a predetermined delay time has passed from the generation of the trigger signal, and the potential contrast begins to be taken in synchronously with timing of termination of a predetermined number of times of the vertical scanning after the reset, and wherein the predetermined delay time is set to a value at which timing of the termination of the predetermined number of times of the vertical scanning after the reset is conformed to timing of passing the hold time.

10. The electron beam test system as defined in claim 8, wherein a trigger signal is generated in connection with a start of holding the test pattern signal, and a potential of the direct current power source and a potential of the held test pattern signal are changed to the reference potential after a predetermined hold time has passed, wherein timing of vertical scanning for image taking-in is reset after a predetermined delay time has passed from the generation of the trigger signal, and the potential contrast begins to be taken in, and wherein the predetermined delay time is set to a value at which timing for resetting the vertical scanning is conformed to timing of passing the hold time.

11. The electron beam test system as defined in claim 1, wherein a potential of the direct current power source of the semiconductor integrated circuit device to be analyzed and a potential of the test pattern signal are directly changed to the reference potential without holding the test pattern signal in timing in which the test pattern signal supplied to the semiconductor integrated circuit device to be analyzed becomes a test pattern signal to be observed, and the potential contrast is taken in right after the change to the reference potential.

12. An electron beam test system which obtains a potential contrast for analysis by irradiating an electron beam to a semiconductor integrated circuit device to be analyzed, the electron beam test system comprising:
   a first stage for placing the semiconductor integrated circuit device to be analyzed;
   a second stage for placing a non-defective semiconductor integrated circuit device for comparison with the semiconductor integrated circuit device to be analyzed;
   a tester which supplies a test pattern signal for analysis to each of the semiconductor integrated circuit device to be analyzed and the non-defective semiconductor integrated circuit device, and holds the test pattern signal at a given timing, and then performs an operation of changing a potential of a direct current power source of each of the semiconductor integrated circuit device to be analyzed and the non-defective semiconductor integrated circuit device and a potential of the test pattern signal that is held to a reference potential;
   a first detector which takes in the potential contrast of the semiconductor integrated circuit device to be analyzed right after the reference potential is set; and
   a second detector which takes in the potential contrast of the non-defective semiconductor integrated circuit device right after the reference potential is set.

13. The electron beam test system as defined in claim 12, system further comprising:
   a first electron gun which irradiates the electron beam to the semiconductor integrated circuit device to be analyzed;
   a second electron gun which irradiates the electron beam to the non-defective semiconductor integrated circuit device;
   a first analytical grid for observing a potential distribution, which is arranged between the first electron gun and the first stage; and
   a second analytical grid for observing the potential distribution, which is arranged between the second electron gun and the second stage.

14. The electron beam test system as defined in claim 12, wherein the reference potential is a ground potential.

15. The electron beam test system as defined in claim 12, comprising:
   a beam control section which irradiates the electron beam to each of the semiconductor integrated circuit device to be analyzed and the non-defective semiconductor integrated circuit device as frame scan irradiation, and controls the electron beam so that the frame scan irradiation is performed during at least a hold period of the test pattern signal and a taking-in period of the potential contrast.

16. The electron beam test system as defined in claim 12, further comprising:
   a contrast image generating section which sequentially takes in the potential contrast plural times during an attenuation period of the potential contrast right after the reference potential is set, and integrates a plurality of taken in potential contrasts in accordance with a given rule to generate a potential contrast image.

17. The electron beam test system as defined in claim 16, wherein the potential contrast image is generated by setting an integration ratio of the potential contrast taken in earliest to be greater than an integration ratio of the potential contrast taken in after the earliest potential contrast.

18. The electron beam test system as defined in claim 12, wherein timing for changing a potential of the direct current power source and a potential of the held test pattern signal to the reference potential and start timing of taking in the potential contrast are determined in connection with a start of holding the test pattern signal.

19. The electron beam test system as defined in claim 18, wherein a trigger signal is generated in connection with a start of holding the test pattern signal, and a potential of the direct current power source and a potential of the held test pattern signal are changed to the reference potential after a predetermined hold time has passed,
   wherein timing of vertical scanning for image taking-in is reset after a predetermined delay time has passed from the generation of the trigger signal, and the potential contrast begins to be taken in synchronously with timing of termination of a predetermined number of times of the vertical scanning after the reset, and
   wherein the predetermined delay time is set to a value at which timing of the termination of the predetermined number of times of the vertical scanning after the reset is conformed to timing of passing the hold time.

20. The electron beam test system as defined in claim 18, wherein a trigger signal is generated in connection with a start of holding the test pattern signal, and a potential of the direct current power source and a potential of the held test pattern signal are changed to the reference potential after a predetermined hold time has passed,
   wherein timing of vertical scanning for image taking-in is reset after a predetermined delay time has passed from the generation of the trigger signal, and the potential contrast begins to be taken in, and
   wherein the predetermined delay time is set to a value at which timing for resetting the vertical scanning is conformed to timing of passing the hold time.

21. The electron beam test system as defined in claim 12, wherein a potential of the direct current power source of each of the semiconductor integrated circuit device to be analyzed and the non-defective semiconductor integrated circuit device and a potential of the test pattern signal are directly changed to the reference potential without holding the test pattern signal in timing in which the test pattern signal supplied to each of the semiconductor integrated circuit device to be analyzed and the non-defective semiconductor integrated circuit device becomes a test pattern signal to be observed, and the potential contrast is taken in right after the change to the reference potential.

22. An electron beam test system which obtains a potential contrast by irradiating an electron beam to a semiconductor integrated circuit device to be analyzed,
   wherein a test pattern signal supplied to the semiconductor integrated circuit device to be analyzed is held at a given timing, and a potential of a direct current power source of the semiconductor integrated circuit device to be analyzed and a potential of the test pattern signal that is held are then changed to a reference potential, and the potential contrast of the semiconductor integrated circuit device to be analyzed is taken in after the direct current power source of the semiconductor integrated circuit device to be analyzed and the potential of the test pattern signal that is held are changed to the reference potential.

23. The electron beam test system as defined in claim 22, wherein the reference potential is a ground potential.

24. The electron beam test system as defined in claim 22, comprising:

a beam control section which irradiates the electron beam to the semiconductor integrated circuit device to be analyzed as frame scan irradiation, and controls the electron beam so that the frame scan irradiation is performed during at least a hold period of the test pattern signal and a taking-in period of the potential contrast.

25. The electron beam test system as defined in claim 22, further comprising:

a contrast image generating section which sequentially takes in the potential contrast plural times during an attenuation period of the potential contrast right after the reference potential is set, and integrates a plurality of taken in potential contrasts in accordance with a given rule to generate a potential contrast image.

26. The electron beam test system as defined in claim 25, wherein the potential contrast image is generated by setting an integration ratio of the potential contrast taken in earliest to be greater than an integration ratio of the potential contrast taken in after the earliest potential contrast.

27. The electron beam test system as defined in claim 22, wherein timing for changing a potential of the direct current power source and a potential of the held test pattern signal to the reference potential and start timing of taking in the potential contrast are determined in connection with a start of holding the test pattern signal.

28. The electron beam test system as defined in claim 27, wherein a trigger signal is generated in connection with a start of holding the test pattern signal, and a potential of the direct current power source and a potential of the held test pattern signal are changed to the reference potential after a predetermined hold time has passed, wherein timing of vertical scanning for image taking-in is reset after a predetermined delay time has passed from the generation of the trigger signal, and the potential contrast begins to be taken in synchronously with timing of termination of a predetermined number of times of the vertical scanning after the reset, and wherein the predetermined delay time is set to a value at which timing of the termination of the predetermined number of times of the vertical scanning after the reset is conformed to timing of passing the hold time.

29. The electron beam test system as defined in claim 27, wherein a trigger signal is generated in connection with a start of holding the test pattern signal, and a potential of the direct current power source and a potential of the held test pattern signal are changed to the reference potential after a predetermined hold time has passed, wherein timing of vertical scanning for image taking-in is reset after a predetermined delay time has passed from the generation of the trigger signal, and the potential contrast begins to be taken in, and wherein the predetermined delay time is set to a value at which timing for resetting the vertical scanning is conformed to timing of passing the hold time.

30. The electron beam test system as defined in claim 22, wherein a potential of the direct current power source of the semiconductor integrated circuit device to be analyzed and a potential of the test pattern signal are directly changed to the reference potential without holding the test pattern signal in timing in which the test pattern signal supplied to the semiconductor integrated circuit device to be analyzed becomes a test pattern signal to be observed, and the potential contrast is taken in right after the change to the reference potential.

31. An electron beam test system which irradiates an electron beam to a semiconductor integrated circuit device to be analyzed and a non-defective semiconductor integrated circuit device for comparison with the semiconductor integrated circuit device to be analyzed, and obtains a potential contrast from each of the semiconductor integrated circuit device to be analyzed and the non-defective semiconductor integrated circuit device, the electron beam test system comprising:

a held test pattern signal supplied to each of the semiconductor integrated circuit device to be analyzed and the non-defective semiconductor integrated circuit device at a given timing, wherein an operation of changing a potential of a direct current power source of each of the semiconductor integrated circuit device to be analyzed and the non-defective semiconductor integrated circuit device and a potential of the held test pattern signal to a reference potential is performed; and wherein the potential contrast of the semiconductor integrated circuit device to be analyzed right after the reference potential is set is taken in, and the potential contrast of the non-defective semiconductor integrated circuit device is taken in right after the reference potential is set.

32. The electron beam test system as defined in claim 31, wherein the reference potential is a ground potential.

33. The electron beam test system as defined in claim 31, comprising:

a beam control section which irradiates the electron beam to each of the semiconductor integrated circuit device to be analyzed and the non-defective semiconductor integrated circuit device as frame scan irradiation, and controls the electron beam so that the frame scan irradiation is performed during at least a hold period of the test pattern signal and a taking-in period of the potential contrast.

34. The electron beam test system as defined in claim 31, further comprising:

a contrast image generating section which sequentially takes in the potential contrast plural times during an attenuation period of the potential contrast right after the reference potential is set, and integrates a plurality of taken in potential contrasts in accordance with a given rule to generate a potential contrast image.

35. The electron beam test system as defined in claim 34, wherein the potential contrast image is generated by setting an integration ratio of the potential contrast taken in earliest to be greater than an integration ratio of the potential contrast taken in after the earliest potential contrast.

36. The electron beam test system as defined in claim 31, wherein timing for changing a potential of the direct current power source and a potential of the held test pattern signal to the reference potential and start timing of taking in the potential contrast are determined in connection with a start of holding the test pattern signal.

37. The electron beam test system as defined in claim 36, wherein a trigger signal is generated in connection with a start of holding the test pattern signal, and a potential of the direct current power source and a potential of the held test pattern signal are changed to the reference potential after a predetermined hold time has passed,
wherein timing of vertical scanning for image taking-in is reset after a predetermined delay time has passed from the generation of the trigger signal, and the potential contrast begins to be taken in synchronously with timing of termination of a predetermined number of times of the vertical scanning after the reset, and
wherein the predetermined delay time is set to a value at which timing of the termination of the predetermined number of times of the vertical scanning after the reset is conformed to timing of passing the hold time.

38. The electron beam test system as defined in claim 36, wherein a trigger signal is generated in connection with a start of holding the test pattern signal, and a potential of the direct current power source and a potential of the held test pattern signal are changed to the reference potential after a predetermined hold time has passed,
wherein timing of vertical scanning for image taking-in is reset after a predetermined delay time has passed from the generation of the trigger signal, and the potential contrast begins to be taken in, and
wherein the predetermined delay time is set to a value at which timing for resetting the vertical scanning is conformed to timing of passing the hold time.

39. The electron beam test system as defined in claim 31, wherein a potential of the direct current power source of each of the semiconductor integrated circuit device to be analyzed and the non-defective semiconductor integrated circuit device and a potential of the test pattern signal are directly changed to the reference potential without holding the test pattern signal in timing in which the test pattern signal supplied to each of the semiconductor integrated circuit device to be analyzed and the non-defective semiconductor integrated circuit device becomes a test pattern signal to be observed, and the potential contrast is taken in right after the change to the reference potential.

40. An electron beam test method, comprising:
holding a test pattern supplied to a semiconductor integrated circuit device to be analyzed for a predetermined time in timing to be observed, and then changing a direct current power source of the semiconductor integrated circuit device to be analyzed and the test pattern signal that is held to a reference potential, and irradiating an electron beam to the semiconductor integrated circuit device to be analyzed; and
generating a potential contrast image for analyzing faulty or breakdown caused by a process defect by taking in the potential contrast right after the direct current power source of the semiconductor integrated circuit device to be analyzed and the test pattern signal that is held are changed to the reference potential.

41. The electron beam test method as defined in claim 40, comprising:
irradiating the electron beam to the semiconductor integrated circuit device to be analyzed as frame scan irradiation, and performing the frame scan irradiation during at least a hold period of the test pattern signal to be supplied and a taking-in period of the potential contrast.

42. The electron beam test method as defined in claim 40, comprising:
sequentially taking in the potential contrast plural times during an attenuation period of the potential contrast right after the reference potential is set, and integrating a plurality of taken in potential contrasts in accordance with a given rule to generate a potential contrast image.

43. An electron beam test method, comprising:
holding a test pattern supplied to a semiconductor integrated circuit device to be analyzed for a predetermined time in timing to be observed, and then changing a direct current power source of the semiconductor integrated circuit device to be analyzed and the test pattern signal that is held to a reference potential, and irradiating an electron beam to the semiconductor integrated circuit device to be analyzed, and holding the test pattern supplied to a non-defective semiconductor integrated circuit device for comparison with the semiconductor integrated circuit device to be analyzed for a predetermined time in timing to be observed, and then changing a direct current power source of the non-defective semiconductor integrated circuit device and the held test pattern signal to the reference potential, and irradiating the electron beam to the non-defective semiconductor integrated circuit device; and
generating a potential contrast image of each of the semiconductor integrated circuit device to be analyzed and the non-defective semiconductor integrated circuit device by taking in the potential contrast of each of the semiconductor integrated circuit device to be analyzed and the non-defective semiconductor integrated circuit device right after the direct current power source of the non-defective semiconductor integrated circuit device and the held test pattern signal are changed to the reference potential, and analyzing faulty or breakdown caused by a process defect of the semiconductor integrated circuit device to be analyzed by comparing the potential contrast image of each of the semiconductor integrated circuit device to be analyzed and the non-defective semiconductor integrated circuit device.

44. The electron beam test method as defined in claim 43, comprising:
irradiating the electron beam to the semiconductor integrated circuit device to be analyzed and the non-defective semiconductor integrated circuit device as frame scan irradiation, and performing the frame scan irradiation during at least a hold period of the test pattern signal to be supplied and a taking-in period of the potential contrast.

45. The electron beam test method as defined in claim 43, comprising:
sequentially taking in the potential contrast plural times during an attenuation period of the potential contrast right after the reference potential is set, and integrating a plurality of taken in potential contrasts in accordance with a given rule to generate a potential contrast image.

* * * * *